(12) United States Patent
Griffin et al.

(10) Patent No.: US 11,387,802 B1
(45) Date of Patent: Jul. 12, 2022

(54) HYBRID PIEZOELECTRIC MICRORESONATOR

(71) Applicants: National Technology & Engineering Solutions of Sandia, LLC, Albuquerque, NM (US); U.S. Army Research Laboratory, Adelphi, MD (US)

(72) Inventors: Benjamin Griffin, Arlington, VA (US); Christopher Nordquist, Albuquerque, NM (US); Ronald G. Polcawich, Derwood, MD (US)

(73) Assignees: National Technology & Engineering Solutions of Sandia, LLC, Albuquerque, NM (US); The United States of America as Represented by the Secretary of the Army, Washington, DC (US)

( * ) Notice: Subject to any disclaimer, the term of this patent is extended or adjusted under 35 U.S.C. 154(b) by 456 days.

(21) Appl. No.: 16/658,339

(22) Filed: Oct. 21, 2019

Related U.S. Application Data

(60) Provisional application No. 62/750,416, filed on Oct. 25, 2018.

(51) Int. Cl.
| | |
|---|---|
| *H03H 9/17* | (2006.01) |
| *H03H 9/02* | (2006.01) |
| *H01L 41/047* | (2006.01) |
| *H01L 41/083* | (2006.01) |
| *H01L 41/08* | (2006.01) |

(Continued)

(52) U.S. Cl.
CPC ..... *H03H 9/02157* (2013.01); *H01L 41/0472* (2013.01); *H01L 41/083* (2013.01);
(Continued)

(58) Field of Classification Search
CPC ........ H03H 9/175; H03H 9/173; H03H 9/132; H03H 9/02157; H01L 41/277;
(Continued)

(56) References Cited

U.S. PATENT DOCUMENTS

| | | | | |
|---|---|---|---|---|
| 6,975,183 B2 * | 12/2005 | Aigner | ................... | H03H 9/174 29/25.35 |
| 2005/0046312 A1 * | 3/2005 | Miyoshi | ................ | H01L 41/273 310/366 |

(Continued)

FOREIGN PATENT DOCUMENTS

| | | | | |
|---|---|---|---|---|
| WO | WO-2016175013 A1 * | 11/2016 | ........... | H01L 41/044 |

OTHER PUBLICATIONS

Piazza, G. et al., "Piezoelectric Aluminum Nitride Vibrating Contour-Mode MEMS Resonators," Journal of Microelectromechanical Systems (2006) 15(6):1406-1418.

(Continued)

*Primary Examiner* — J. San Martin
(74) *Attorney, Agent, or Firm* — Mark A. Dodd

(57) ABSTRACT

A hybrid ferroelectric/non-ferroelectric piezoelectric microresonator is disclosed. The hybrid microresonator uses a ferroelectric layer as the actuator as ferroelectric materials typically have higher actuation coefficients than non-ferroelectric piezoelectric materials. The hybrid microresonator uses a non-ferroelectric piezoelectric layer as the sensor layer as non-ferroelectric piezoelectric materials typically have higher sensing coefficients than ferroelectric materials. This hybrid microresonator design allows the independent optimization of actuator and sensor materials. This hybrid microresonator design may be used for bulk acoustic wave contour mode resonators, bulk acoustic wave solidly mounted resonators, free-standing bulk acoustic resonators, and piezoelectric transformers.

19 Claims, 4 Drawing Sheets

(51) Int. Cl.
*H01L 41/107* (2006.01)
*H01L 41/187* (2006.01)
*H01L 41/193* (2006.01)
*H03H 3/02* (2006.01)
*H03H 9/13* (2006.01)
*H01L 41/277* (2013.01)

(52) U.S. Cl.
CPC ........ *H01L 41/0825* (2013.01); *H01L 41/107* (2013.01); *H01L 41/187* (2013.01); *H01L 41/1871* (2013.01); *H01L 41/1873* (2013.01); *H01L 41/1875* (2013.01); *H01L 41/1876* (2013.01); *H01L 41/1878* (2013.01); *H01L 41/193* (2013.01); *H01L 41/277* (2013.01); *H03H 3/02* (2013.01); *H03H 9/02102* (2013.01); *H03H 9/132* (2013.01); *H03H 9/173* (2013.01); *H03H 9/175* (2013.01)

(58) Field of Classification Search
CPC ............... H01L 41/193; H01L 41/1878; H01L 41/1876; H01L 41/1875; H01L 41/1873; H01L 41/1871; H01L 41/187; H01L 41/107; H01L 41/0825; H01L 41/083
See application file for complete search history.

(56) References Cited

U.S. PATENT DOCUMENTS

| | | | | |
|---|---|---|---|---|
| 2009/0289526 | A1* | 11/2009 | Sinha | H03H 9/205 310/325 |
| 2013/0229465 | A1* | 9/2013 | Fujii | H01L 41/29 29/25.35 |
| 2018/0069168 | A1* | 3/2018 | Ikeuchi | H01L 41/31 |
| 2018/0287047 | A1* | 10/2018 | Rinaldi | H01L 41/107 |
| 2019/0229256 | A1* | 7/2019 | Dejaeger | H01L 41/0471 |
| 2020/0287511 | A1* | 9/2020 | Reinhardt | H03H 9/176 |
| 2021/0119600 | A1* | 4/2021 | Makkonen | H03H 9/02015 |

OTHER PUBLICATIONS

Reger, R. W. et al., "Near-Zero Power Accelerometer Wakeup System," 2017 IEEE Sensors, Oct. 29-Nov. 1, 2017, Glasgow, UK, 3 pages.

Reger, R. W. et al., "Aluminum Nitride Piezoelectric Microphones as Zero-Power Passive Acoustic Filters," Transducers (2017) Kaoshiung, Taiwan, Jun. 18-22, pp. 2207-2210.

Ruby, R., "Review and Comparison of Bulk Acoustic Wave FBAR, SMR Technology," IEEE Ultrasonics Symposium (2007) 102:1029-1040.

Sanchez, L. M. et al., "Optimization of PbTiO3 seed layers and Pt metallization for PZT-based piezoMEMS actuators," J. Mater. Res. (2013) 28(14):1920-1931.

Wojciechowski, K. E. et al., "Single-Chip Precision Oscillators Based on Multi-Frequency, High-Q Aluminum Nitride MEMS Resonators," Transducers (2009) Denver, CO, Jun. 21-25, pp. 2126-2130.

* cited by examiner

HYBRID PIEZOELECTRIC MICRORESONATOR

CROSS-REFERENCE TO RELATED APPLICATION

This application claims the benefit of U.S. Provisional Application No. 62/750,416, filed Oct. 25, 2018, which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

TECHNICAL FIELD

The present invention relates to a hybrid piezoelectric microresonator employing a ferroelectric actuator and a non-ferroelectric piezoelectric sensor to improve the overall coupling coefficient.

BACKGROUND

Most microresonators, such as those found in many bulk acoustic wave ("BAW") devices and piezoelectric transformers, employ a three-layer structure, as illustrated in FIG. 1. A prior art microresonator 100 includes an actuator electrode 110, a sensor electrode 130, and an intervening piezoelectric film 120. The piezoelectric film 120 may, for example, comprise aluminum nitride (AlN).

One of the primary performance metrics for microresonators is the coupling coefficient $k_i$, defined as:

$$k_i^2 = e_{31} \cdot g_{31} \qquad \text{(Eq. 1)}$$

in which $e_{31}$ is the actuation coefficient and $g_{31}$ is the sensing coefficient.

The actuation coefficient, $e_{31}$, is the figure of merit for the actuator, and corresponds to the amount of output stress created by the actuator per unit volt applied to the input of the actuator. The sensing coefficient, $g_{31}$, is the figure of merit for the sensor, and corresponds to the open circuit output voltage created by the sensor per unit stress applied to the input of the sensor. In operation, the microresonator, upon receiving an input voltage, creates a stress within the microresonator via the actuator, while the stress within the microresonator produces an output voltage from the sensor.

A prior art microresonator 100 employs a single piezoelectric film 120 that serves as both the actuator and the sensor. This structure requires compromises as most piezoelectric films have relatively larger actuation coefficients at the expense of relatively lower sensing coefficients, or vice-versa.

Thus, there exists a need for a microresonator in which the actuation coefficient, $e_{31}$, and the sensing coefficient, $g_{31}$, may be independently optimized to improve overall performance of the microresonator.

SUMMARY

One aspect of the present invention relates to a microresonator structure that allows the independent optimization of the actuation coefficient, $e_{31}$, and the sensing coefficient, $g_{31}$, by using two separate piezoelectric layers. In yet another aspect of the present invention, one of the two separate piezoelectric layers comprises a ferroelectric material.

By employing two separate piezoelectric layers, the layer corresponding to the actuator can be formed of a piezoelectric material having a greater actuation coefficient, even if its sensing coefficient is relatively smaller. Conversely, the layer corresponding to the sensor can be formed of a piezoelectric material having a greater sensing coefficient, even if its actuation coefficient is relatively smaller. The actuator layer is preferably formed of a piezoelectric material with a high $e_{31}$ (e.g., a ferroelectric material such as lead zirconate titanate (PZT)), while the sensor layer is preferably formed of a piezoelectric material with a high $g_{31}$ (e.g., a non-ferroelectric material such aluminum nitride (AlN)). As will be appreciated by one of skill in the art, all ferroelectric materials are also piezoelectric materials, but not all piezoelectric materials are ferroelectric materials.

In at least one embodiment of the present invention, a hybrid piezoelectric microresonator comprises a first electrode, a ferroelectric actuator layer on the first electrode, a second electrode on the ferroelectric actuator layer, a non-ferroelectric piezoelectric sensor layer on the second electrode, and a third electrode on the non-ferroelectric piezoelectric sensor layer.

In various embodiments of the present invention: the first and second electrodes receive an input electrical signal, the second and third electrodes transmit an output electrical signal, and the second electrode is the ground electrode; the first, second, and third electrodes include one or more layers; the first and third electrodes have a plate or interdigitated electrode structure; the first and third electrodes have an interdigitated electrode structure with a common periodicity; the interdigitated electrode structure of the first electrode is horizontally aligned with the interdigitated electrode structure of the third electrode; and the interdigitated electrode structure of the first electrode is offset in a horizontal direction from the interdigitated electrode structure of the third electrode by half a period of the common periodicity.

In other embodiments of the present invention: the ferroelectric actuator layer is formed of PZT, BiFeO$_3$, LiNbO$_3$, KNbO$_3$, NaNbO$_3$, (K,Na)NbO$_3$, LiTaO$_3$, BaTiO$_3$, PbTiO$_3$, SrTiO$_3$, (Ba,Sr)TiO$_3$, or PVDF; the non-ferroelectric piezoelectric sensor layer is formed of AN, GaN, InN, Sc$_x$Al$_{(1-x)}$N, or ZnO; and the hybrid piezoelectric microresonator includes a cavity on the side of the first electrode opposite the ferroelectric actuator layer or on the side of the third electrode opposite the non-ferroelectric piezoelectric sensor layer.

In still other embodiments of the present invention: the hybrid piezoelectric microresonator is a bulk acoustic wave contour mode resonator with a resonant frequency that is a function of at least the width and the length of the bulk acoustic wave contour mode resonator; the hybrid piezoelectric microresonator is a free-standing bulk acoustic resonator with a resonant frequency that is a function of at least a combined thickness of the first electrode, the ferroelectric actuator layer, the second electrode, the non-ferroelectric piezoelectric sensor layer, and the third electrode; the hybrid piezoelectric microresonator includes an acoustic Bragg reflector on the side of the first electrode opposite the ferroelectric actuator layer or on the side of the third electrode opposite the non-ferroelectric piezoelectric sensor layer; the hybrid piezoelectric microresonator is a bulk acoustic wave solidly mounted resonator with a resonant frequency that is a function of at least a combined thickness of the first electrode, the ferroelectric actuator layer, the second electrode, the non-ferroelectric piezoelectric sensor layer, and the third electrode; and the hybrid piezoelectric microresonator is a hybrid piezoelectric transformer.

In further embodiments of the present invention: the hybrid piezoelectric microresonator includes at least one etch stop layer with one etch stop layer between the first electrode and the ferroelectric actuator layer or between the second electrode and the non-ferroelectric piezoelectric sensor layer; the hybrid piezoelectric microresonator includes a first etch stop layer between the first electrode and the ferroelectric actuator layer and a second etch stop layer between the second electrode and the non-ferroelectric piezoelectric sensor layer; and the thickness and composition of each of the first electrode, the ferroelectric actuator layer, the second electrode, the non-ferroelectric piezoelectric sensor layer, and the third electrode cause the hybrid piezoelectric microresonator to be temperature self-compensating.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

DETAILED DESCRIPTION

Prior art piezoelectric microresonators typically employ a single piezoelectric layer that must serve two purposes. First, the piezoelectric layer must act as an actuator, converting the input electrical signal into a corresponding mechanical stress signal. Second, the piezoelectric layer must act as a sensor, converting the resonant mechanical stress signal into an output electrical signal. This leads to a compromise when selecting the piezoelectric layer material as those materials with higher actuation coefficients, $e_{31}$, typically have lower sensing coefficients, $g_{31}$ or vice-versa.

This compromise is evident when comparing the actuation coefficients and sensing coefficients of ferroelectric PZT and non-ferroelectric piezoelectric AlN, shown in Table 1.

TABLE 1

Actuation and Sensing Coefficients.

| Coefficient | PZT | AlN |
| --- | --- | --- |
| $e_{31,f}$ (C/m$^2$) | −8 to −12 | −1.05 |
| $|g_{31}|$ (V/m/Pa) | 0.018 | 0.027 |

As shown in Table 1, PZT may be an order of magnitude more efficient in generating mechanical stress per unit voltage input, while AlN is 50% more efficient in generating output voltage per unit input stress. AlN also offers the advantage of a larger signal-to-noise ratio relative to PZT: $21.4 \times 10^5$ Pa$^{1/2}$ for AlN versus $11.7$-$20.3 \times 10^5$ Pa$^{1/2}$ for PZT. See R. W. Reger et al., "Near-Zero Power Accelerometer Wakeup System," IEEE Sensors Conference, Glasgow, Scotland, Oct. 29-Nov. 1, 2017, the contents of which are incorporated herein by reference. Thus, by employing PZT as the ferroelectric actuator layer and AlN as the non-ferroelectric piezoelectric sensor layer, each material is used to its best advantage.

Alternative ferroelectric materials include, for example, bismuth ferrite (BiFeO$_3$), lithium niobate (LiNbO$_3$), potassium niobate (KNbO$_3$), sodium niobate (NaNbO$_3$), the alloy sodium potassium niobate ((K,Na)NbO$_3$), lithium tantalate (LiTaO$_3$), barium titanate (BaTiO$_3$), lead titanate (PbTiO$_3$), strontium titanate (SrTiO$_3$), the alloy barium strontium titanate ((Ba,Sr)TiO$_3$), and polyvinylidene fluoride (PVDF). Alternative non-ferroelectric piezoelectric materials include, for example, gallium nitride (GaN), indium nitride (InN), scandium aluminum nitride (ScAlN), and zinc oxide (ZnO).

Figure 2A:
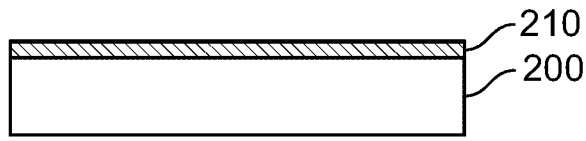
FIGS. 2A-2E illustrate the fabrication sequence for a hybrid piezoelectric microresonator in accordance with one or more embodiments of the present invention.

FIGS. 2A-2E illustrate the fabrication sequence for an exemplar hybrid microresonator in accordance with one or more embodiments of the present invention. FIG. 2A illustrates a first electrode 210 formed on a substrate 200. The substrate 200 may be any suitable substrate including a semiconductor wafer, for example a silicon (Si), silicon carbide (SiC), or gallium arsenide (GaAs) wafer; a processed semiconductor wafer with one or more integrated circuits or one or more microelectromechanical systems (MEMSs) formed thereon; or a composite wafer, for example a semiconductor (or silicon)-on-insulator (SOI) wafer.

The first electrode 210 may comprise one or more layers and may have any suitable composition(s) and thickness(es). In some embodiments, the first electrode 210 comprises three layers: the first being Ti, the second being TiO$_2$, while the third is Pt. Other embodiments may include, for example, two layers with the first being ZnO and the second being Pt. Still other embodiments, for example, non-RF applications, may employ a highly doped (for example, 1 mΩ-cm resistivity) substrate 200, in which case the substrate 200 also acts as the first electrode 210 without requiring the deposition of a separate first electrode 210. See R. W. Reger et al., "Aluminum Nitride Piezoelectric Microphones as Zero-Power Passive Acoustic Filters," 19th International Conference on Solid-State Sensors, Actuators and Microsystems, Kaohsiung, Taiwan, Jun. 18-22, 2017, the contents of which are incorporated herein by reference. Selection of the material used to form the first electrode 210 is driven, at least in part, by the ferroelectric material used to form the ferroelectric actuator layer 220.

The first electrode 210 may be formed by any suitable method. In some embodiments, the first electrode 210 may be deposited by physical vapor deposition (PVD), while in other embodiments the first electrode 210 may be deposited by chemical vapor deposition (CVD). PVD may take many forms, including sputtering, evaporation, and pulsed laser deposition (PLD) of the material used to form the first electrode 210. CVD may likewise take many forms, including low-pressure CVD, ultrahigh vacuum CVD, plasma-enhanced CVD (PECVD), metalorganic CVD (MOCVD) and vapor-phase epitaxy (VPE), among others. In a preferred embodiment, the first electrode 210 is deposited by sputtering.

Figure 2B:
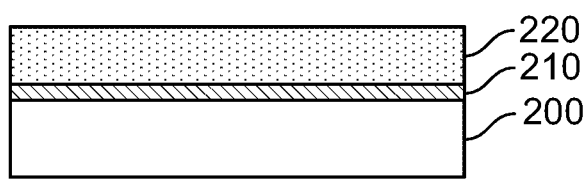

In FIG. 2B, a ferroelectric actuator layer 220 is formed on the first electrode 210, as ferroelectric materials typically have larger actuation coefficients than non-ferroelectric piezoelectric materials. The ferroelectric actuator layer 220 may have any suitable composition and thickness. In a preferred embodiment, the ferroelectric actuator layer 220 comprises the ferroelectric material PZT. As the resonant frequency of the microresonator depends, at least in part, on the thickness of the ferroelectric actuator layer 220, the ultimate thickness of the ferroelectric actuator layer 220 should be selected in view of the desired resonant frequency and the type of microresonator. As a person of ordinary skill in the art will appreciate, the resonant frequency of the microresonator will be a function of at least the thickness of each of the layers and their material properties, including stiffness and density.

The ferroelectric actuator layer 220 may be formed by any suitable method. In some embodiments, the ferroelectric actuator layer 220 may be deposited by PVD, CVD, or chemical solution deposition (CSD). When the ferroelectric actuator layer 220 comprises PZT, the corresponding deposition technique preferably is RF sputtering, PLD, or CSD. When employing RF sputtering or PLD of PZT for depositing the piezoelectric actuator layer 220, a high substrate temperature is preferable during the deposition process. Alternatively, the wafer should undergo a rapid thermal anneal (RTA) process after growth by RF sputtering or PLD to ensure the PZT has the desired perovskite crystal phase. CSD typically employs deposition by spin coating followed by pyrolysis to remove the carrier solvent(s). Depending upon the desired thickness, multiple rounds of deposition and pyrolysis may be required when using CSD. Once the desired thickness is achieved, the CSD grown layer undergoes an RTA process, resulting in the PZT having the desired perovskite crystal phase. CSD growth of PZT frequently employs depositing one or more seed layers prior to deposition of the PZT layer to improve surface morphology and decrease processing temperatures. Example seed layers may include a $PbTiO_3$ (PTO) seed layer on platinum (Pt) (111). See L. M. Sanchez et al., "Optimization of $PbTiO_3$ Seed Layers and Pt Metallization for PZT-based PiezoMEMS Actuators," J. Mater. Res., vol. 28, no. 14, pp. 1920-1931 (2013), the contents of which are incorporated herein by reference.

To simplify fabrication of the final microresonator, some embodiments may include an etch stop layer (not illustrated) formed between the first electrode 210 and the ferroelectric actuator layer 220. In some embodiments that employ one or more seed layers, the seed layer(s) may serve as the etch stop layer.

Figure 2C:
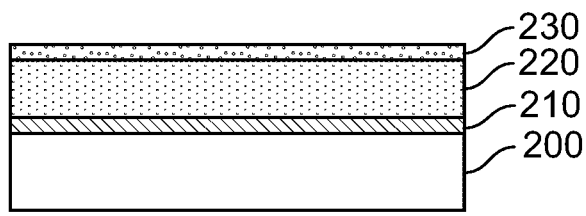

FIG. 2C illustrates a second electrode 230 formed on the ferroelectric actuator layer 220. The second electrode 230 may comprise one or more layers and may have any suitable composition(s) and thickness(es). In some embodiments, the second electrode 230 comprises three layers—a 20 nm layer of titanium (Ti), a 50 nm layer of titanium nitride (TiN), and a 100 nm layer of aluminum/copper (AlCu). Other embodiments may include, for example, two layers, such as Ti/TiN or Ti/AlCu. Still other embodiments may include, for example, a single layer of AlCu, Ti, Pt, molybdenum (Mo), or tungsten (W). See "Piezoelectric MEMS Resonators," H. Bhurga and G. Piazza eds., Springer (2017), the contents of which are incorporated herein by reference. Preferably the second electrode 230 forms a good seed or template for growth of the non-ferroelectric piezoelectric sensor layer 240. The two- and three-layer electrode 230 examples just described satisfy this seeding function when the non-ferroelectric piezoelectric sensor layer 240 comprises AlN.

The second electrode 230 may be formed by any suitable method. In some embodiments, the second electrode 230 may be deposited by PVD, while in other embodiments the second electrode 230 may be deposited by CVD. In a preferred embodiment, the second electrode 230 is deposited by PVD.

During operation, the first electrode 210 and the second electrode 230 receive an input electrical signal. In a preferred embodiment, the second electrode 230 is connected to ground.

Figure 2D:
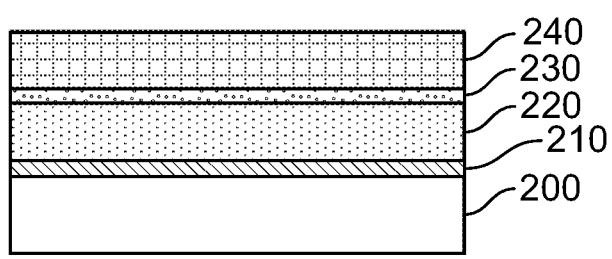

In FIG. 2D, a non-ferroelectric piezoelectric sensor layer 240 is formed on the second electrode 230, as non-ferroelectric piezoelectric materials frequently have larger sensor coefficients than ferroelectric materials. The non-ferroelectric piezoelectric sensor layer 240 may have any suitable composition and thickness. In a preferred embodiment, the non-ferroelectric piezoelectric sensor layer 240 comprises AlN. In an alternative preferred embodiment, the non-ferroelectric piezoelectric sensor layer 240 comprises $Sc_xAl_{(1-x)}N$ at a Sc composition x of 0 to 41%. As the resonant frequency of the microresonator depends, at least in part, on the thickness of the non-ferroelectric piezoelectric sensor layer 240, the ultimate thickness of the non-ferroelectric piezoelectric sensor layer 240 should be selected in view of the desired resonant frequency and the type of microresonator.

The non-ferroelectric piezoelectric sensor layer 240 may be formed by any suitable method. In some embodiments, the non-ferroelectric piezoelectric sensor layer 240 may be deposited by PVD. When the non-ferroelectric piezoelectric sensor layer 240 comprises AlN, the corresponding deposition technique preferably is reactive sputtering. When employing reactive sputtering of AlN for depositing the non-ferroelectric piezoelectric sensor layer 240, an Al target is employed with $N_2$ and Ar as the process gases.

To simplify fabrication of the final microresonator, some embodiments may include an etch stop layer (not illustrated) formed between the second electrode 230 and the non-ferroelectric piezoelectric sensor layer 240. This etch stop layer typically comprises an oxide having a thickness of approximately 50 nm. The etch stop layer may alternatively comprise Mo or Pt.

Figure 2E:
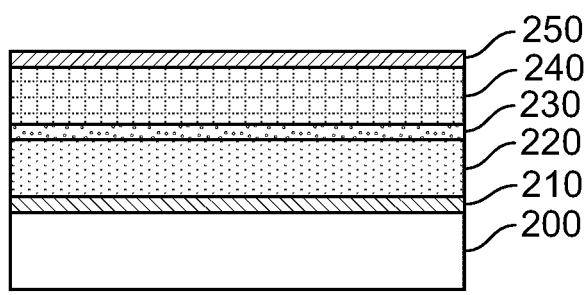

FIG. 2E illustrates a third electrode 250 formed on the non-ferroelectric piezoelectric sensor layer 240. The third electrode 250 may comprise one or more layers and may have any suitable composition(s) and thickness(es). In some embodiments, the third electrode 250 comprises a single 200 nm layer of AlCu. Other embodiments may include, for example, two layers—a 700 nm layer of AlCu and a 50 nm layer of TiN.

The third electrode 250 may be formed by any suitable method. In some embodiments, the third electrode 250 may be deposited by PVD, while in other embodiments the third electrode 250 may be deposited by CVD. In a preferred embodiment, the third electrode 250 is deposited by PVD.

During operation, the third electrode 250 and the second electrode 230 transmit an output electrical signal. In a preferred embodiment, the second electrode 230 is again connected to ground.

While the embodiment illustrated in FIGS. 2A-2E places the first electrode 210 adjacent the substrate 200 with the third electrode 250 on the top, in other embodiments the order of the electrodes and layers may be inverted. In these embodiments, the third electrode 250 is on the bottom, adjacent to the substrate 200, while the first electrode 210 is on the top. A person of ordinary skill in the art may select one orientation or the other depending upon a number of factors, including, for example, ease of fabrication.

Figure 1:
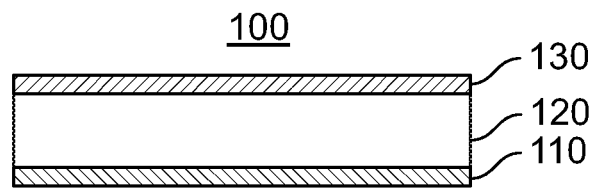
FIG. 1 illustrates a prior art microresonator.
Figure 3A:
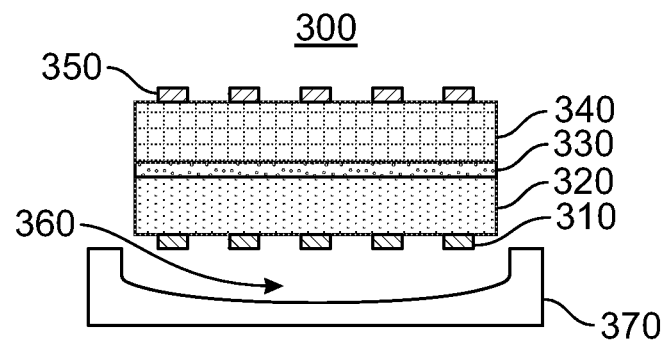
FIGS. 3A-3B illustrate hybrid bulk acoustic wave contour mode resonators in accordance with one or more embodiments of the present invention.

In at least one embodiment, the hybrid piezoelectric structure just described is used to form a hybrid bulk acoustic wave (BAW) contour mode resonator (CMR). While traditional BAW CMRs employ interdigitated input and output electrodes on the frontside with a grounded backside electrode, this configuration would not benefit from the high actuation and sensing coefficients possible with the present hybrid piezoelectric structure. Thus, a hybrid BAW CMR 300, as illustrated in FIG. 3A, using the present hybrid piezoelectric structure employs a first electrode 310, a ferroelectric actuator layer 320, a second electrode 330, a non-ferroelectric piezoelectric sensor layer 340, and a third electrode 350. As further illustrated in FIG. 3A, a cavity 360 is etched into the substrate 370 below the first electrode 310. If desired, for example for ease of fabrication, the order of the electrodes and layers may be inverted, such that the third electrode 350 is on the bottom, adjacent to the cavity 360, while the first electrode 310 is on the top.

Figure 3B:
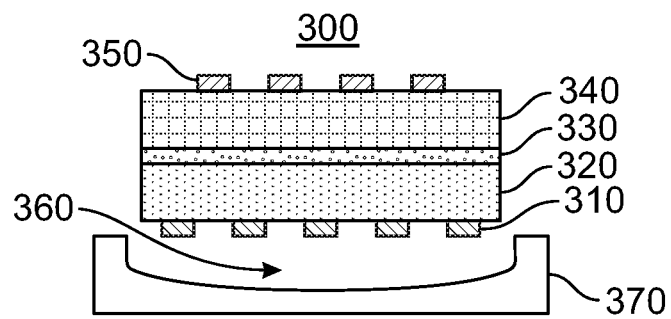

As with a traditional BAW CMR device, the geometries of various components within the hybrid BAW CMR 300 may be selected to tune the resonant frequency and quality factor Q of the device. See G. Piazza et al., "Piezoelectric Aluminum Nitride Vibrating Contour-Mode MEMS Resonators," J. MEMS vol. 15, no. 6, pp. 1406-1418 (2006), the contents of which are incorporated herein by reference. In particular, a person of skill in the art can alter primarily the overall width and length of the device to arrive at the desired resonant frequency and Q, though altering the thicknesses of the individual layers will, to a lesser extent, also affect the resonant frequency and Q. Further, the first electrode 310 and the third electrode 350 may be interdigitated electrodes having a common periodicity rather than plate structures, in which the width and the periodicity of the interdigitated electrodes may be optimized for the desired resonant frequency and Q. In addition, if the first electrode 310 and the third electrode 350 are interdigitated electrodes, they may be horizontally aligned as illustrated in FIG. 3A or they may be horizontally offset by half a period, though not disposed on the same surface, as illustrated in FIG. 3B.

Figure 4:
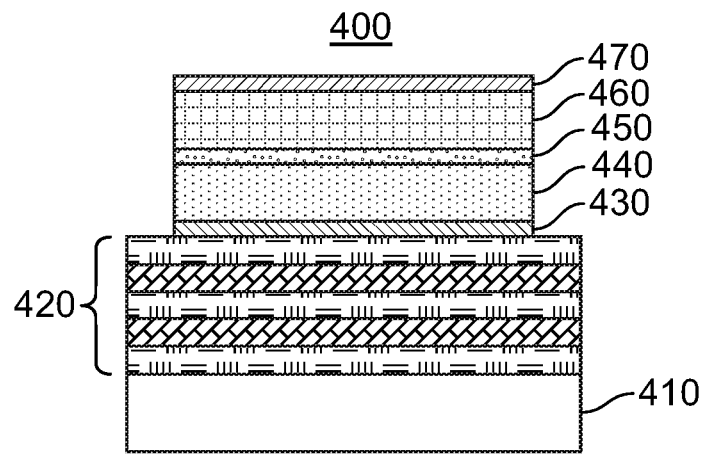
FIG. 4 illustrates a hybrid bulk acoustic wave solidly mounted resonator in accordance with one or more embodiments of the present invention.

In at least one embodiment, the hybrid piezoelectric structure is used to form a hybrid BAW solidly mounted resonator (SMR). As with the hybrid BAW CMR, the hybrid BAW SMR likewise requires a modified configuration relative to a traditional BAW SMR to again account for the separate actuator and sensor layers. As illustrated in FIG. 4, a hybrid BAW SMR 400 employs a substrate 410, an acoustic Bragg reflector 420, a first electrode 430, a ferroelectric actuator layer 440, a second electrode 450, a non-ferroelectric piezoelectric sensor layer 460, and a third electrode 470. If desired, for example for ease of fabrication, the order of the electrodes and layers may be inverted, such that the third electrode 470 is on the bottom, adjacent to the acoustic Bragg reflector 420, while the first electrode 430 is on the top.

As with a traditional BAW SMR device, the geometries of various components within the hybrid BAW SMR 400 may be selected to tune the resonant frequency and quality factor Q of the device. See R. Ruby, "Review and Comparison of Bulk Acoustic Wave FBAR, SMR Technology," 2007 IEEE Ultrasonics Symposium, pp. 1029-1040 (2007), the contents of which are incorporated herein by reference. In particular, a person of skill in the art can alter primarily the thicknesses of the individual layers and the design of the acoustic Bragg reflector 420 to arrive at the desired resonant frequency and Q.

Figure 5:
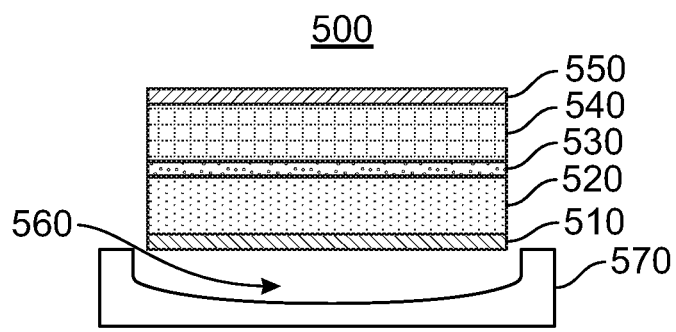
FIG. 5 illustrates a hybrid free-standing bulk acoustic resonator in accordance with one or more embodiments of the present invention.

In at least one embodiment, the hybrid piezoelectric structure is used to form a hybrid free-standing bulk acoustic resonator (FBAR). As with the hybrid BAW CMR, the hybrid FBAR likewise requires a modified configuration relative to a traditional FBAR to again account for the separate actuator and sensor layers. As illustrated in FIG. 5, a hybrid FBAR 500 employs a first electrode 510, a ferroelectric actuator layer 520, a second electrode 530, a non-ferroelectric piezoelectric sensor layer 540, and a third electrode 550. As further illustrated in FIG. 5, a cavity 560 is etched into the substrate 570 below the first electrode 510. If desired, for example for ease of fabrication, the order of the electrodes and layers may be inverted, such that the third electrode 550 is on the bottom, adjacent to the cavity 560, while the first electrode 510 is on the top.

As with a traditional FBAR device, the geometries of various components within the hybrid FBAR 500 may be selected to tune the resonant frequency and quality factor Q of the device. In particular, a person of skill in the art can alter primarily the thicknesses and compositions of the various layers of the device to arrive at the desired resonant frequency and Q.

The hybrid BAW SMR offers at least one benefit over the hybrid BAW CMR and the hybrid FBAR, but also suffers from at least one drawback relative to the hybrid BAW CMR and the hybrid FBAR. While all three designs are typically only post-CMOS fabrication compatible due to the material used to form the ferroelectric actuator layer 220, the hybrid BAW SMR offers the advantage that it does not require etching a cavity beneath the device. In contrast, both the hybrid BAW CMR and the hybrid FBAR require etching a cavity beneath the device, a process typically employed only in the fabrication of microelectromechanical systems (MEMS). See R. Ruby, "Review and Comparison of Bulk Acoustic Wave FBAR, SMR Technology" and K. E. Wojchiechowski, "Single-Chip Precision Oscillators Based on Multi-Frequency High-Q Aluminum Nitride MEMS Resonators," Transducers 2009, pp. 2126-2130 (2009), the contents of each of which are incorporated herein by reference.

The hybrid BAW SMR uses an acoustic Bragg reflector to reflect the acoustic waves, as opposed to the device/air interface used reflect the acoustic waves in both the hybrid BAW CMR and the hybrid FBAR. As a device/air interface has a higher reflection coefficient than an acoustic Bragg reflector, the hybrid BAW SMR will have a lower quality factor than a hybrid BAW CMR or a hybrid FBAR. This results in a lower coupling coefficient $k_t^2$ and greater insertion loss for the hybrid BAW SMR than for either the hybrid BAW CMR or the hybrid FBAR.

Figure 6A:
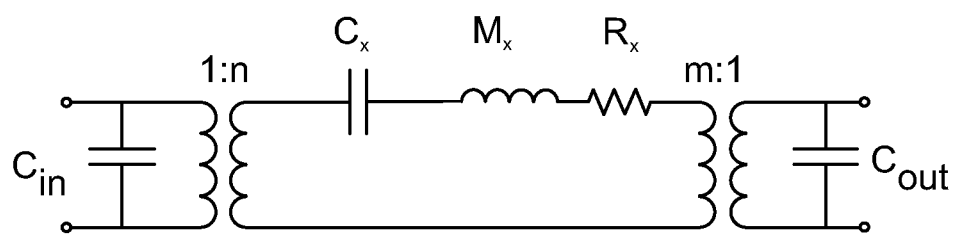
FIG. 6A illustrates the equivalent circuit for a generic two-port transformer.
Figure 6B:
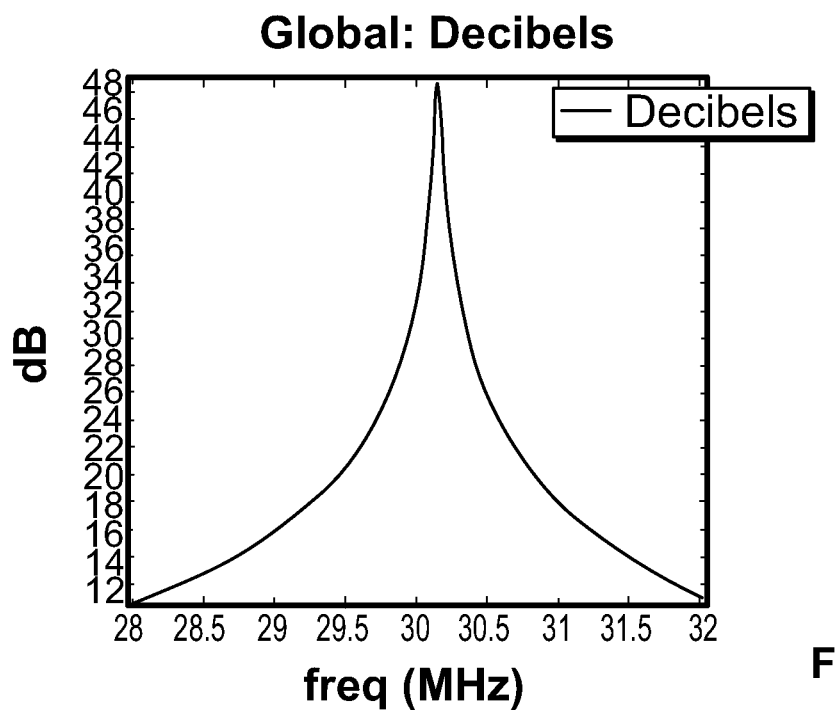
FIGS. 6B-6C illustrate the modeled performance of hybrid piezoelectric transformers in accordance with one or more embodiments of the present invention.
Figure 6C:
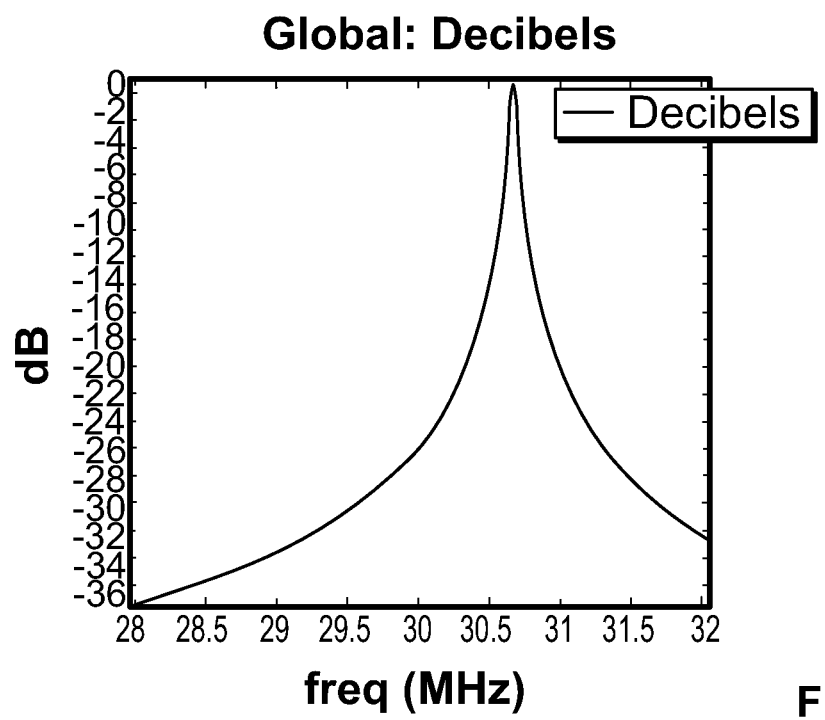

In at least one embodiment, the hybrid piezoelectric structure is used to form a hybrid piezoelectric transformer. In a traditional piezoelectric transformer, the turns ratio is manipulated by altering the number of interdigitated electrodes or the area. In contrast, the turns ratio in a hybrid piezoelectric transformer is manipulated through the selection of the actuator and sensor materials. FIG. 6A illustrates the equivalent circuit for a generic two-port transformer. The characteristics of this two-port transformer were simulated for two different hybrid piezoelectric transformers using finite element analysis (COMSOL) and assumed idealized zero mass, zero stiffness electrodes. In the first case, PZT was used as the actuator material while AlN was used as the sensor material, with the resultant ratio of open circuit voltage to input drive voltage illustrated in FIG. 6B. As shown in FIG. 6B, this ratio peaks at 46 dB, i.e., 200×, at a resonant frequency of 30.1 MHz. In the second case, AlN was used as the actuator material while PZT was used as the sensor material, with the resultant ratio peaking at 0 dB, i.e., 1×, at the resonant frequency of 30.6 MHz, as illustrated in FIG. 6C. The results of these simulations show the benefit of using a ferroelectric actuator layer and a non-ferroelectric piezoelectric sensor layer as each is used to its best advantage. As required for a passive reciprocal device, the devices exhibit reciprocal behavior and energy conservation because the voltage gain of the transformer is accounted for by the differences between the input and output impedances of the two simulated devices.

In at least one embodiment, a properly designed hybrid piezoelectric structure would not require active temperature compensation, i.e., the hybrid piezoelectric structure is temperature self-compensating. In particular, the stiffness of a PZT layer increases with temperature, which would counteract the decreasing stiffness typical of an AlN layer and the electrodes. For this reason, a person of skill in the art can determine the appropriate layer compositions and thicknesses for the actuator electrode, the ferroelectric actuator layer, the intermediate electrode, the non-ferroelectric piezoelectric sensor layer, and the sensor electrode such that the overall hybrid piezoelectric structure does not require active temperature compensation.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A hybrid piezoelectric microresonator comprising:
a first electrode;
a ferroelectric actuator layer on the first electrode;
a second electrode on the ferroelectric actuator layer;
a non-ferroelectric piezoelectric sensor layer on the second electrode; and
a third electrode on the non-ferroelectric piezoelectric sensor layer, the first and third electrodes having an interdigitated electrode structure with a common periodicity.

2. The hybrid piezoelectric microresonator of claim 1,
wherein the first and second electrodes are adapted to receive an input electrical signal;
wherein the second and third electrodes are adapted to transmit an output electrical signal; and
wherein the second electrode is a ground electrode.

3. The hybrid piezoelectric microresonator of claim 1, wherein each of the first, second, and third electrodes comprises one or more layers.

4. The hybrid piezoelectric microresonator of claim 1, wherein the first and third electrodes have a plate structure or an interdigitated electrode structure.

5. The hybrid piezoelectric microresonator of claim 1, wherein the interdigitated electrode structure of the first electrode is horizontally aligned with the interdigitated electrode structure of the third electrode.

6. The hybrid piezoelectric microresonator of claim 1, wherein the interdigitated electrode structure of the first electrode is offset in a horizontal direction from the interdigitated electrode structure of the third electrode by half a period of the common periodicity.

7. The hybrid piezoelectric microresonator of claim 1, wherein the ferroelectric actuator layer comprises one of PZT, $BiFeO_3$, $LiNbO_3$, $KNbO_3$, $NaNbO_3$, $(K,Na)NbO_3$, $LiTaO_3$, $BaTiO_3$, $PbTiO_3$, $SrTiO_3$, $(Ba,Sr)TiO_3$, and PVDF.

8. The hybrid piezoelectric microresonator of claim 1, wherein the non-ferroelectric piezoelectric sensor layer comprises one of AlN, GaN, InN, $Sc_xAl_{(1-x)}N$, and ZnO.

9. The hybrid piezoelectric microresonator of claim 1 further comprising a cavity, the cavity being on a side of the first electrode opposite the ferroelectric actuator layer or on a side of the third electrode opposite the non-ferroelectric piezoelectric sensor layer.

10. The hybrid piezoelectric microresonator of claim 9,
wherein the hybrid piezoelectric microresonator is a bulk acoustic wave contour mode resonator; and
wherein a resonant frequency of the bulk acoustic wave contour mode resonator is a function of at least a width and a length of the bulk acoustic wave contour mode resonator.

11. The hybrid piezoelectric microresonator of claim 9,
wherein the hybrid piezoelectric microresonator is a free-standing bulk acoustic resonator; and
wherein a resonant frequency of the free-standing bulk acoustic resonator is a function of at least a combined thickness of the first electrode, the ferroelectric actuator layer, the second electrode, the non-ferroelectric piezoelectric sensor layer, and the third electrode.

12. The hybrid piezoelectric microresonator of claim 1 further comprising an acoustic Bragg reflector, the acoustic Bragg reflector being on a side of the first electrode opposite the ferroelectric actuator layer or on a side of the third electrode opposite the non-ferroelectric piezoelectric sensor layer.

13. The hybrid piezoelectric microresonator of claim 12,
wherein the hybrid piezoelectric microresonator is a bulk acoustic wave solidly mounted resonator; and
wherein a resonant frequency of the bulk acoustic wave solidly mounted resonator is a function of at least a combined thickness of the first electrode, the ferroelectric actuator layer, the second electrode, the non-ferroelectric piezoelectric sensor layer, and the third electrode.

14. The hybrid piezoelectric microresonator of claim 1 wherein the hybrid piezoelectric microresonator is a hybrid piezoelectric transformer.

15. The hybrid piezoelectric microresonator of claim 1 further comprising at least one etch stop layer.

16. The hybrid piezoelectric microresonator of claim 15, wherein one of the at least one etch stop layers is located between the first electrode and the ferroelectric actuator layer.

17. The hybrid piezoelectric microresonator of claim 15, wherein one of the at least one etch stop layers is located between the second electrode and the non-ferroelectric piezoelectric sensor layer.

18. The hybrid piezoelectric microresonator of claim 1 further comprising:
- a first etch stop layer, the first etch stop layer being located between the first electrode and the ferroelectric actuator layer; and
- a second etch stop layer, the second stop layer being located between the second electrode and the non-ferroelectric piezoelectric sensor layer.

19. The hybrid piezoelectric microresonator of claim 1 wherein a thickness and a composition of each of the first electrode, the ferroelectric actuator layer, the second electrode, the non-ferroelectric piezoelectric sensor layer, and the third electrode are adapted to cause the hybrid piezoelectric microresonator to be temperature self-compensating.

* * * * *